US011677361B2

(12) United States Patent
Chen et al.

(10) Patent No.: US 11,677,361 B2
(45) Date of Patent: Jun. 13, 2023

(54) RF AMPLIFIER APPARATUS

(71) Applicant: RichWave Technology Corp., Taipei (TW)

(72) Inventors: Chih-Sheng Chen, Taipei (TW); Ching Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 298 days.

(21) Appl. No.: 17/143,160

(22) Filed: Jan. 7, 2021

(65) Prior Publication Data

US 2022/0140793 A1 May 5, 2022

(30) Foreign Application Priority Data

Nov. 3, 2020 (TW) .................................. 109138285

(51) Int. Cl.
*H03F 3/19* (2006.01)
*H04B 1/40* (2015.01)

(52) U.S. Cl.
CPC .......... *H03F 3/19* (2013.01); *H03F 2200/129* (2013.01); *H03F 2200/372* (2013.01); *H03F 2200/451* (2013.01); *H04B 1/40* (2013.01)

(58) Field of Classification Search
CPC ....................................................... H03F 3/19
See application file for complete search history.

(56) References Cited

U.S. PATENT DOCUMENTS

| 4,052,751 | A | * | 10/1977 | Shepard | ................. | H02H 3/331 |
| | | | | | | 361/50 |
| 4,922,210 | A | * | 5/1990 | Flachenecker | ........... | H03B 5/08 |
| | | | | | | 331/117 R |
| 5,252,820 | A | * | 10/1993 | Shinomiya | .............. | H03F 3/087 |
| | | | | | | 250/214 R |
| 5,852,384 | A | * | 12/1998 | Sakakura | ............. | H03B 5/1847 |
| | | | | | | 331/49 |
| 5,991,606 | A | | 11/1999 | Rummeli et al. | | |
| 10,524,209 | B2 | | 12/2019 | Ayraud et al. | | |
| 10,536,121 | B2 | | 1/2020 | Lee et al. | | |
| 2004/0120418 | A1 | | 6/2004 | Pasternak et al. | | |
| 2005/0134374 | A1 | * | 6/2005 | Hench | ....................... | H03F 1/08 |
| | | | | | | 330/86 |
| 2012/0142294 | A1 | | 6/2012 | Cercelaru | | |

(Continued)

FOREIGN PATENT DOCUMENTS

TW I597957 9/2017

*Primary Examiner* — Patricia T Nguyen
(74) *Attorney, Agent, or Firm* — JCIPRNET

(57) ABSTRACT

The invention provides a radio frequency (RF) amplifier apparatus including an amplifier and a resonance circuit. An input terminal of the amplifier receives an RF signal. The amplifier amplifies a first frequency component of the RF signal and outputs the amplified first frequency component to an output terminal of the amplifier. A first terminal and a second terminal of the resonance circuit are respectively coupled to the input terminal and the output terminal of the amplifier. The resonance circuit provides a low impedance path for a second frequency component of the RF signal between the input terminal and the output terminal of the amplifier, and provides a high impedance path for the first frequency component of the RF signal between the input terminal and the output terminal of the amplifier.

18 Claims, 13 Drawing Sheets

(56) References Cited

U.S. PATENT DOCUMENTS

| | | | | |
|---|---|---|---|---|
| 2016/0094048 A1* | 3/2016 | Bae | ……………… | H02J 50/12 307/104 |
| 2018/0248526 A1 | 8/2018 | Lee et al. | | |
| 2020/0313630 A1* | 10/2020 | Granger-Jones | ………. | H03F 1/32 |

* cited by examiner

RF AMPLIFIER APPARATUS

CROSS-REFERENCE TO RELATED APPLICATION

This application claims the priority benefit of Taiwan application no. 109138285, filed on Nov. 3, 2020. The entirety of the above-mentioned patent application is hereby incorporated by reference herein and made a part of this specification.

TECHNICAL FIELD

The invention relates to an amplifier circuit, and more particularly, relates to an RF amplifier apparatus.

BACKGROUND

An RF amplifier could amplify or process electronic signals. In a communication system, the RF amplifier could amplify a tiny radio frequency (RF) signal received by an antenna. In actual application scenarios, the out of band (OOB) noise may be injected into the received RF signal. The out of band noise would affect a sensitivity of a measurement system. How to suppress the out of band noise at a specific frequency is one of the important technical issues in this technical field.

SUMMARY

The invention provides an RF amplifier apparatus to realize the amplifier out of band (OOB) suppression.

In an embodiment of the invention, the RF amplifier apparatus includes a first amplifier and a first resonant circuit. An input terminal of the first amplifier is suitable for coupling to a signal providing terminal to input a first RF signal. The first amplifier is configured to amplify a first frequency component of the first RF signal and output the amplified first frequency component to an output terminal of the first amplifier. A first terminal and a second terminal of the first resonance circuit are respectively coupled to the input terminal and the output terminal of the first amplifier. The first resonant circuit is configured to provide a first low impedance path for a second frequency component of the first RF signal between the input terminal and the output terminal of the first amplifier, and provides a high impedance path for the first frequency component of the first RF signal between the input terminal and the output terminal of the first amplifier.

Based on the above, the first resonance circuit described in the embodiments of the invention is configured in the RF amplifier apparatus. The first resonant circuit may provide the low impedance path for the second frequency component of the first RF signal between the input terminal and the output terminal of the first amplifier. Accordingly, the out of band noise may be effectively suppressed.

To make the aforementioned more comprehensible, several embodiments accompanied with drawings are described in detail as follows.

DETAILED DESCRIPTION

Figure 1:
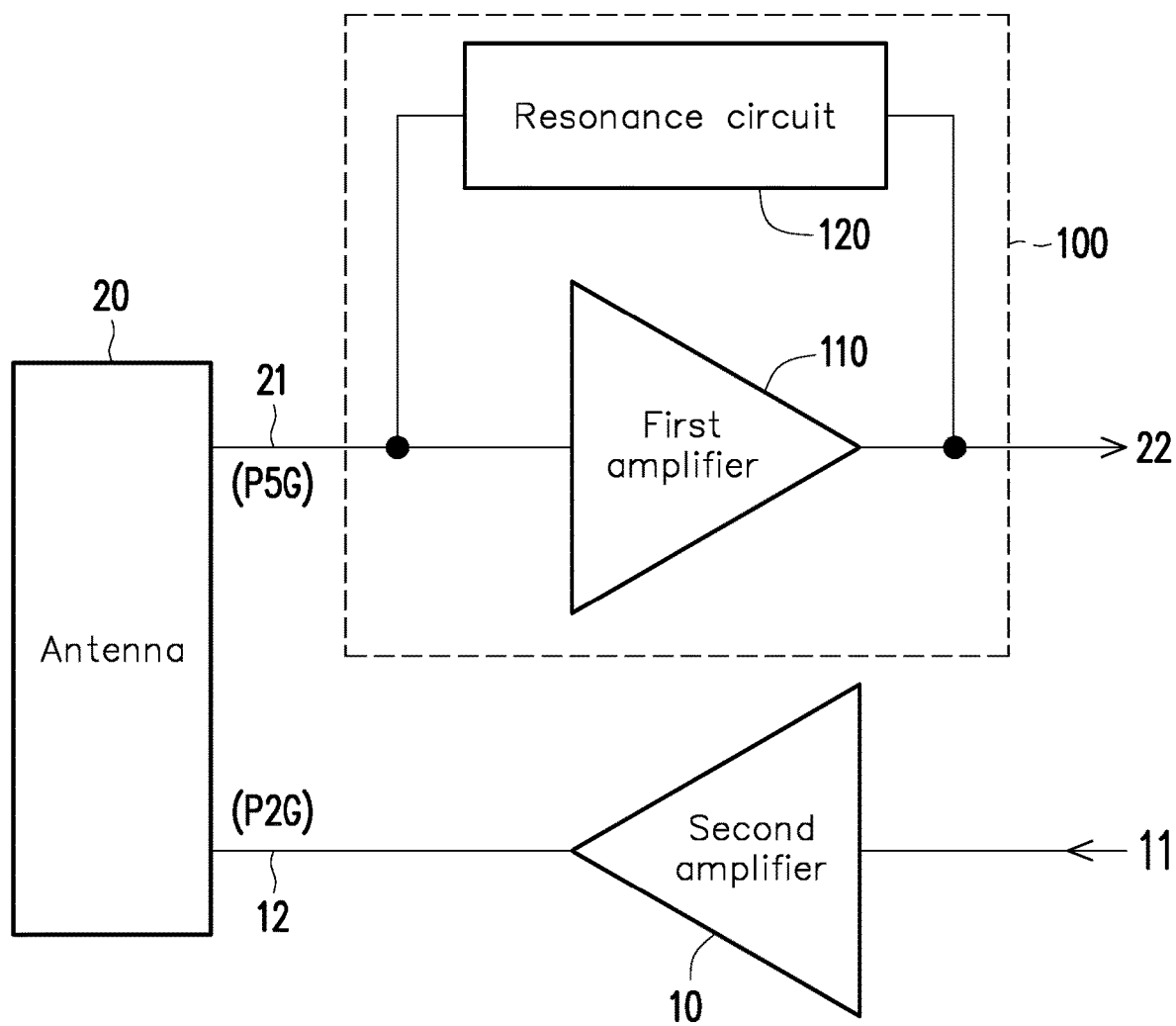
FIG. 1 is a circuit block diagram of a radio frequency apparatus according to an embodiment of the invention.

The term "coupled (or connected)" used in this specification (including claims) may refer to any direct or indirect connection means. For example, "a first device is coupled (connected) to a second device" should be interpreted as "the first device is directly connected to the second device" or "the first device is indirectly connected to the second device through other devices or connection means". The terms such as "first", "second" and the like as recited in full text of the specification (including claims) are intended to give the elements names or distinguish different embodiments or scopes, and are not intended to limit an upper limit or a lower limit of the number of the elements nor limit an order of the elements. Moreover, wherever possible, elements/components/steps with same reference numerals represent same or similar parts in the drawings and embodiments. Elements/components/steps with the same reference numerals or names in different embodiments may be cross-referenced.

FIG. 1 is a circuit block diagram of a radio frequency apparatus according to an embodiment of the invention. The radio frequency apparatus shown in FIG. 1 includes a signal providing terminal, an RF amplifier apparatus 100 having a first amplifier 110 and a resonant circuit 120, and a second amplifier 10. In this embodiment, the signal providing terminal is, for example, an antenna 20, and the second amplifier 10 is, for example, a power amplifier. In some application scenarios, the antenna 20 may be shared by radio frequency circuits of different frequency bands. For example (but not limited thereto), the RF amplifier apparatus 100 may be configured in a fifth-generation mobile communication technology (5G) path P5G, and the second amplifier 10 may be configured in a second-generation mobile communication technology (2G) path P2G. The RF amplifier apparatus 100 may amplify a 5G signal (an RF signal 21) received by the antenna 20, and output the amplified 5G signal (an RF signal 22) to a next stage circuit (not shown). The second amplifier 10 may amplify a 2G signal (an RF signal 11) output by a previous stage circuit, and output the amplified 2G signal (an RF signal 12) to the antenna 20.

In actual application scenarios, the out of band (OOB) noise may be injected into the RF signal of the 5G path PGS. For instance, assuming that a frequency f of the RF signal 12 in the 2G path P2G is 2.45 GHz, the OOB noise at a frequency 2f (i.e., 4.9 GHz) may be coupled to the 5G path P5G. In the 5G path P5G, the power of the OOB noise at the frequency 2f will be amplified to reduce the performance of the first amplifier 110, such as linearity. The following embodiments will explain how to suppress the OOB noise of the 5G path P5G.

The RF amplifier apparatus 100 shown in FIG. 1 includes the first amplifier 110 and the resonant circuit 120. This embodiment does not limit the implementation of the first amplifier 110. In this embodiment, the first amplifier 110 may be a low noise amplifier (LNA). An input terminal of the first amplifier 110 is suitable for coupling to the signal providing terminal (e.g., the antenna 20) to input the RF signal 21. The first amplifier 110 may amplify the RF signal 21 and output the amplified RF signal 22 to an output terminal of the first amplifier 110. The RF signal 21 received by the antenna 20 includes a first frequency component f1, and the amplified RF signal 12 output by the second amplifier 10 includes a second frequency component f2. The second frequency component f2 of the amplified RF signal 12 will be coupled to the 5G path P5G and become the second frequency component f2 of the RF signal 21. According to design requirements, in some embodiments, the first amplifier 110 may also be the power amplifier. In this case, the antenna 20 may be replaced by an RF processing circuit as the signal providing terminal for providing the RF signal 21, and the second amplifier 10 coupled to the signal providing terminal may be the low noise amplifier.

A first terminal and a second terminal of the resonance circuit 120 are respectively coupled to the input terminal and the output terminal of the first amplifier 110. The resonant circuit 120 may provide a high impedance path for the first frequency component f1 of the RF signal 21 between the input terminal and the output terminal of the first amplifier 110. The resonant circuit 120 may also provide a low impedance path for the second frequency component f2 of the RF signal 21 (i.e., the OOB noise) between the input terminal and the output terminal of the first amplifier 110. The high impedance path and the low impedance path described in the embodiments of the invention are used to describe the relationship between impedances of the two, rather than limiting the impedance values of the two. In this embodiment, the impedance of the resonance circuit 120 to the first frequency component f1 of the RF signal 21 is greater than the impedance of the resonance circuit 120 to the second frequency component f2 of the RF signal 21.

Based on the above, the resonance circuit 120 of this embodiment is configured in the RF amplifier apparatus 100. The resonance circuit 120 may provide the low impedance path for the second frequency component f2 of the RF signal 21 (i.e., the OOB noise) between the input terminal and the output terminal of the first amplifier 110 to form a negative feedback path of the second frequency component f2 from the output terminal to the input terminal while reducing the interference of the first frequency component f1 between the input terminal and the output terminal to maintain the gain. Therefore, the OOB noise could be effectively suppressed.

Figure 2:
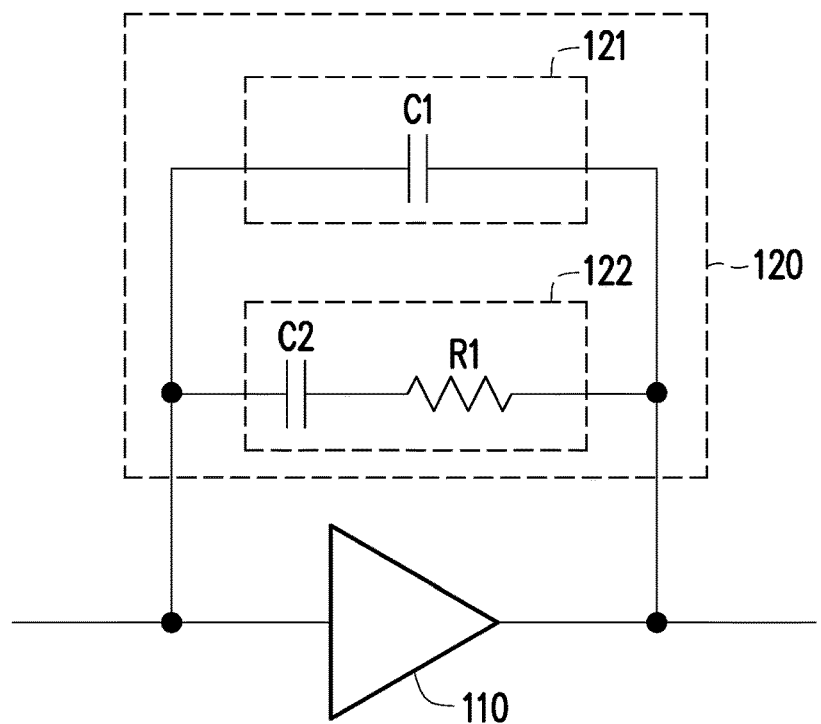
FIG. 2 is a circuit block diagram of a resonant circuit shown in FIG. 1 according to an embodiment of the invention.

FIG. 2 is a circuit block diagram of the resonant circuit 120 shown in FIG. 1 according to an embodiment of the invention. The resonant circuit 120 shown in FIG. 2 includes a resonance component 121 and a resonance component 122. A first terminal of the resonance component 121 and a first terminal of the resonance component 122 are coupled to the first terminal of the resonance circuit 120, i.e., coupled to the input terminal of the first amplifier 110. A second terminal of the resonance component 121 and a second terminal of the resonance component 122 are coupled to the second terminal of the resonance circuit 120, i.e., coupled to the output terminal of the first amplifier 110.

In the embodiment shown in FIG. 2, the resonance component 121 includes a capacitor C1, and the resonance component 122 includes a capacitor C2 and a resistor R1. A first terminal and a second terminal of the capacitor C1 are respectively coupled to the first terminal and the second terminal of the resonant circuit 120. The resistor R1 and the capacitor C2 are connected in series between the first terminal of the resonant circuit 120 and the second terminal of the resonant circuit 120. The resonance component 121 and the resonance component 122 together provide the high impedance path for the first frequency component f1 of the RF signal 21. The resonance component 122 provides the low impedance path for the second frequency component f2 of the RF signal 21.

Figure 3:
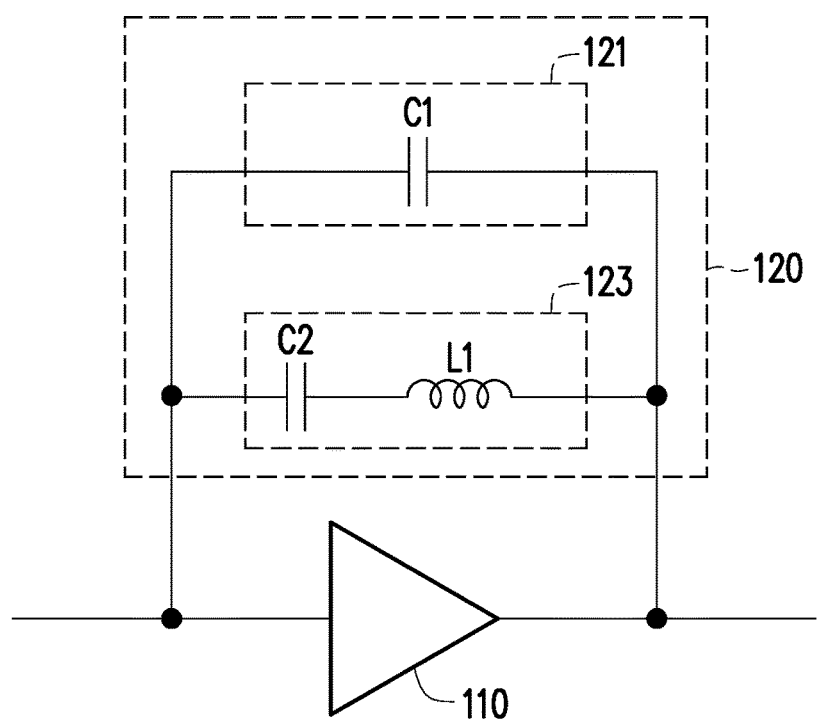
FIG. 3 is a circuit block diagram of a resonant circuit shown in FIG. 1 according to another embodiment of the invention.

FIG. 3 is a circuit block diagram of the resonant circuit 120 shown in FIG. 1 according to another embodiment of the invention. The resonant circuit 120 shown in FIG. 3 includes a resonance component 121 and a resonance component 123. The resonant component 121 and the resonant component 123 could be deduced by analogy with reference to the related description of the resonant component 121 and the resonant component 122 shown in FIG. 2, which is not repeated hereinafter. In the embodiment shown in FIG. 3, the resonance component 123 includes a capacitor C2 and an inductor L1. The inductor L1 and the capacitor C2 are connected in series between the first terminal of the resonant circuit 120 and the second terminal of the resonant circuit 120. The resonance component 121 and the resonance component 123 together provide the high impedance path for the first frequency component f1 of the RF signal 21. The resonance component 123 provides the low impedance path for the second frequency component f2 of the RF signal 21.

Figure 4:
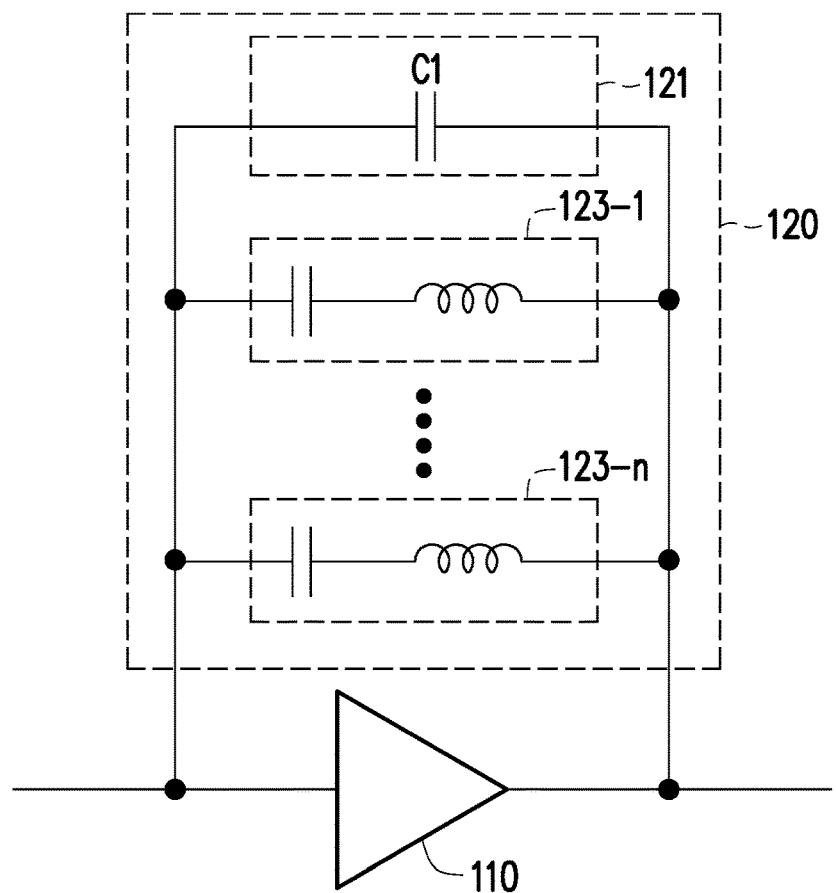
FIG. 4 is a circuit block diagram of a resonant circuit shown in FIG. 1 according to yet another embodiment of the invention.

In any case, the implementation of the resonance circuit 120 shown in FIG. 1 should not be limited to the embodiments shown in FIG. 2 and FIG. 3. For example, the resonance circuit 120 may include more resonance components. FIG. 4 is a circuit block diagram of the resonant circuit 120 shown in FIG. 1 according to yet another embodiment of the invention. The resonance circuit 120 shown in FIG. 4 includes a resonance component 121 and n resonance components 123 (e.g., a resonance component 123-1 to a resonance component 123-n shown in FIG. 4). Here, n is an integer determined according to design requirements. For instance, the n resonance components 123 may provide n low impedance paths for the OOB noises at different frequencies of the RF signal 21. The resonant component 121 could be deduced by analogy with reference to the related description of the resonant component 121 shown in FIG. 2, and the resonant component 123-1 to the resonant component 123-n could be deduced by analogy with reference to the related description of the resonant component 123 shown in FIG. 3, which is not repeated hereinafter.

Figure 5:
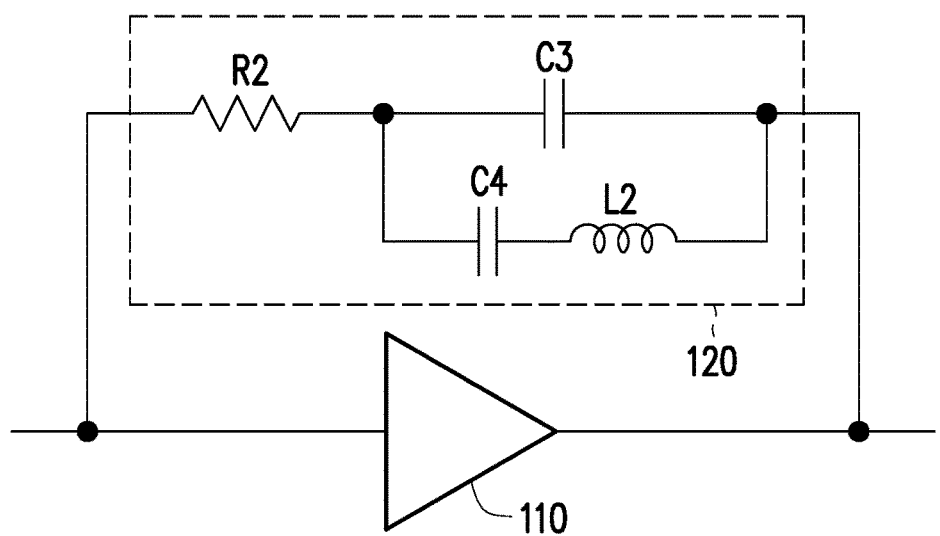
FIG. 5 is a circuit block diagram of a resonant circuit shown in FIG. 1 according to still another embodiment of the invention.

FIG. 5 is a circuit block diagram of the resonant circuit 120 shown in FIG. 1 according to still another embodiment of the invention. The resonant circuit 120 shown in FIG. 5 includes a resistor R2, a capacitor C3, a capacitor C4 and an inductor L2. The capacitor C3 and the resistor R2 are connected in series between the first terminal and the second terminal of the resonant circuit 120. The inductor L2 and the capacitor C4 are connected in series between a first terminal and a second terminal of the capacitor C3.

Figure 6:
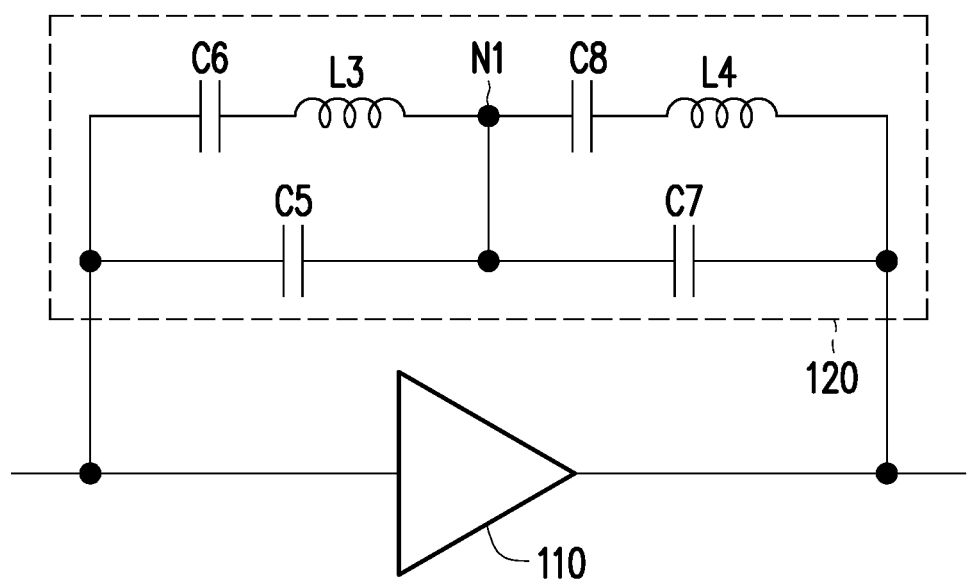
FIG. 6 is a circuit block diagram of a resonant circuit shown in FIG. 1 according to again another embodiment of the invention.

FIG. 6 is a circuit block diagram of the resonant circuit 120 shown in FIG. 1 according to again another embodiment of the invention. The resonant circuit 120 shown in FIG. 6 includes a capacitor C5, a capacitor C6, a capacitor C7, a capacitor C8, an inductor L3 and an inductor L4. The capacitor C5 is coupled between the first terminal of the first resonant circuit 120 and a common node N1. The inductor L3 and the capacitor C6 are connected in series between the first terminal of the resonant circuit 120 and the common node N1. The capacitor C7 is coupled between the common node N1 and the second terminal of the resonant circuit 120. The inductor L4 and the capacitor C8 are connected in series between the common node N1 and the second terminal of the resonant circuit 120.

Figure 7:
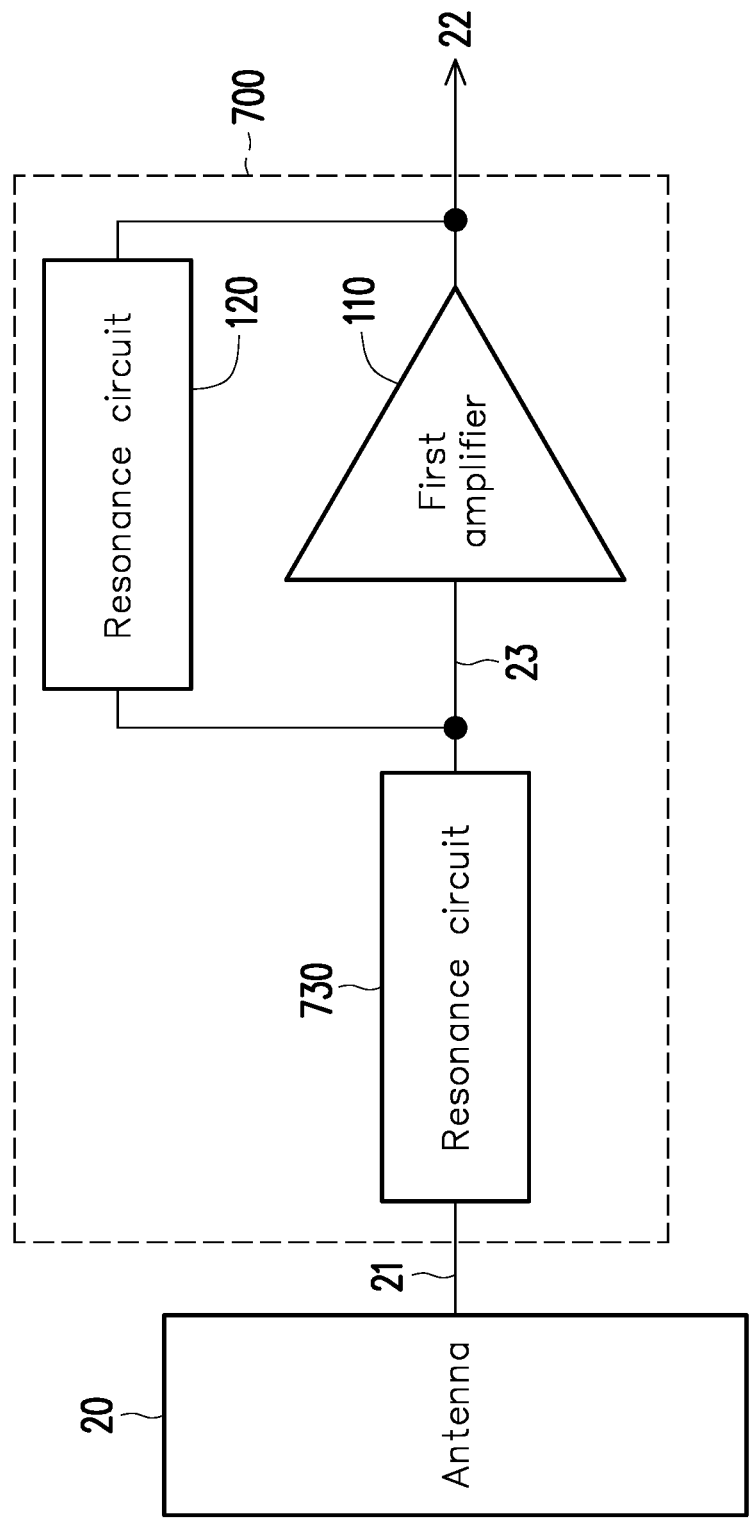
FIG. 7 is a circuit block diagram illustrating a radio frequency apparatus according to another embodiment of the invention.

FIG. 7 is a circuit block diagram illustrating a radio frequency apparatus according to another embodiment of the invention. The radio frequency apparatus shown in FIG. 7 includes an antenna 20 and an RF amplifier apparatus 700. The RF amplifier apparatus 700 may amplify the RF signal 21 received by the antenna 20, and output the amplified RF signal 22 to the next stage circuit (not shown). The antenna 20, the RF signal 21, the RF signal 22 and the RF amplifier apparatus 700 shown in FIG. 7 could be deduced by analogy with reference to the related description of the antenna 20, the RF signal 21, the RF signal 22 and the RF amplifier apparatus 100 shown in FIG. 1, which is not repeated hereinafter.

The RF amplifier apparatus 700 shown in FIG. 7 includes a first amplifier 110, a resonant circuit 120 and a resonant circuit 730. The first amplifier 110 and the resonance circuit 120 shown in FIG. 7 could be deduced by analogy with reference to the related description of the first amplifier 110 and the resonance circuit 120 shown in FIG. 1 to FIG. 6, which is not repeated hereinafter. In the embodiment shown by FIG. 7, a first terminal of the resonant circuit 730 is coupled to a signal providing terminal (e.g., the antenna 20) to receive the RF signal 21. A second terminal of the resonant circuit 730 is coupled to the input terminal of the first amplifier 110 to provide an RF signal 23. The resonant circuit 730 may provide a low impedance path for the first frequency component f1 of the RF signal 21 between the first terminal and the second terminal of the resonant circuit 730 to generate the RF signal 23. The resonant circuit 730 may also provide a high impedance path for a third frequency component f3 of the RF signal 21 (i.e., the OOB noise) between the first terminal and the second terminal of the resonant circuit 730. In an embodiment, the third frequency component f3 is the same as the second frequency component f2 described above to enhance the suppression of the OOB noise having the second frequency component f2. In this embodiment, the impedance of the resonance circuit 730 to the third frequency component f3 of the RF signal 21 is greater than the impedance of the resonance circuit 730 to the first frequency component f1 of the RF signal 21.

Based on the above, the resonance circuit 730 of this embodiment is configured in the RF amplifier apparatus 700. The resonant circuit 730 may provide a high impedance path for the third frequency component f3 of the RF signal 21 (i.e., the OOB noise) between the output terminal of the first amplifier 110 and the antenna 20. Therefore, the OOB noise could be effectively suppressed.

Figure 8:
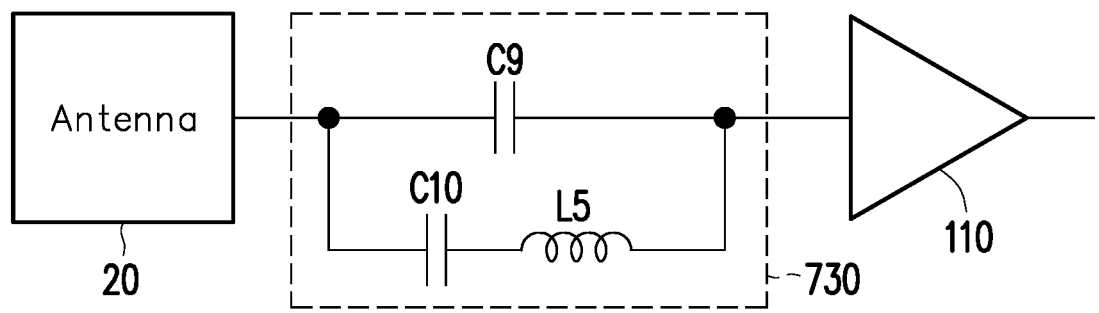
FIG. 8 is a circuit block diagram of a resonant circuit shown in FIG. 7 according to an embodiment of the invention.

FIG. 8 is a circuit block diagram of the resonant circuit 730 shown in FIG. 7 according to an embodiment of the invention. The resonant circuit 730 shown in FIG. 8 includes a capacitor C9, a capacitor C10 and an inductor L5. A first terminal of the capacitor C9 is suitable for coupling to the signal providing terminal (e.g., the antenna 20). A second terminal of the capacitor C9 is coupled to the input terminal of the first amplifier 110. The inductor L5 and the capacitor C10 are connected in series between the first terminal and the second terminal of the capacitor C9.

Figure 9:
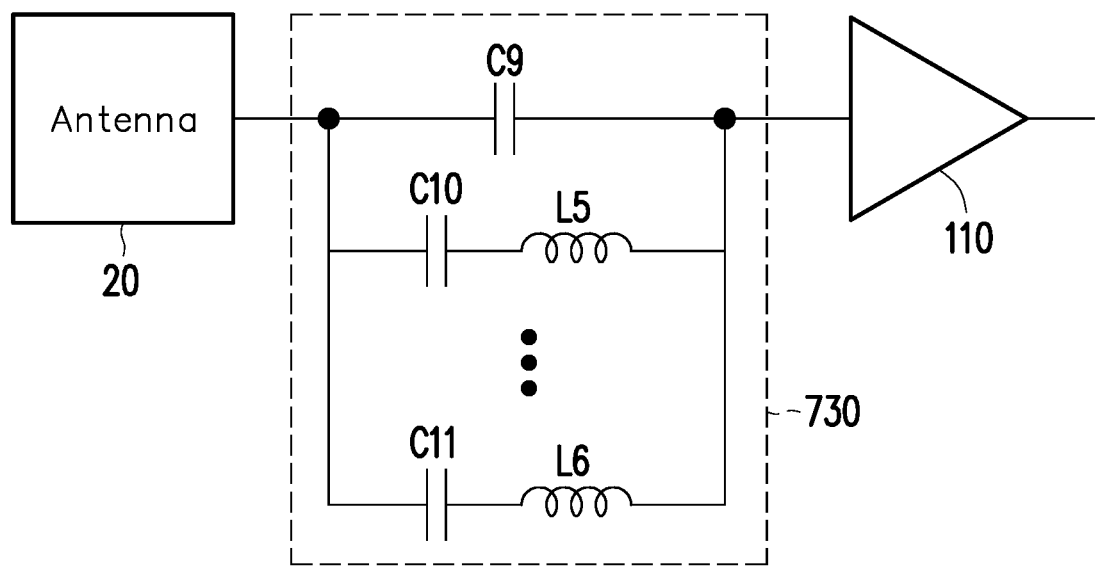
FIG. 9 is a circuit block diagram of a resonant circuit shown in FIG. 7 according to another embodiment of the invention.

FIG. 9 is a circuit block diagram of the resonant circuit 730 shown in FIG. 7 according to another embodiment of the invention. The resonant circuit 730 shown in FIG. 9 includes a capacitor C9, a capacitor C10, a capacitor C11, an inductor L5 and an inductor L6. A first terminal of the capacitor C9 is suitable for coupling to the signal providing terminal (e.g., the antenna 20). A second terminal of the capacitor C9 is coupled to the input terminal of the first amplifier 110. The inductor L5 and the capacitor C10 are connected in series between the first terminal and the second terminal of the capacitor C9. The inductor L6 and the capacitor C11 are connected in series between the first terminal and the second terminal of the capacitor C9.

Figure 10:
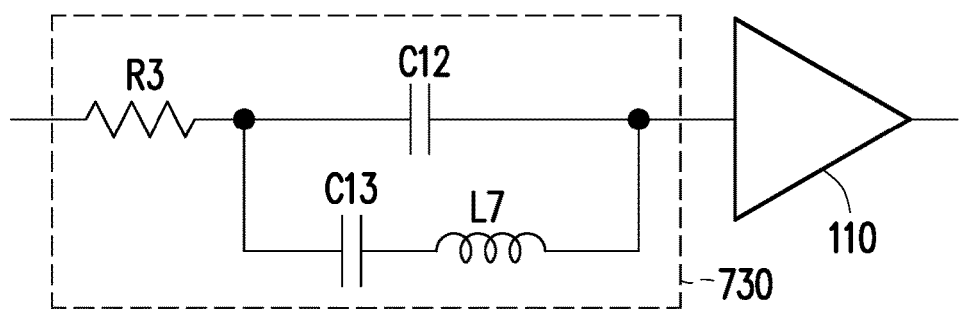
FIG. 10 is a circuit block diagram of a resonant circuit shown in FIG. 7 according to yet another embodiment of the invention.

FIG. 10 is a circuit block diagram of the resonant circuit 730 shown in FIG. 7 according to yet another embodiment of the invention. In this embodiment, the first amplifier 110 is more suitable as the power amplifier. In this case, the antenna 20 may be replaced by an RF processing circuit as the signal providing terminal for providing the RF signal 21. The resonant circuit 730 shown in FIG. 10 includes a resistor R3, a capacitor C12, a capacitor C13 and an inductor L7. A first terminal of the resistor R3 is suitable for coupling to the signal providing terminal. The capacitor C12 and the resistor R3 are connected in series between the signal providing terminal and the input terminal of the first amplifier 110. The inductor L7 and the capacitor C13 are connected in series between a first terminal and a second terminal of the capacitor C12.

Figure 11:
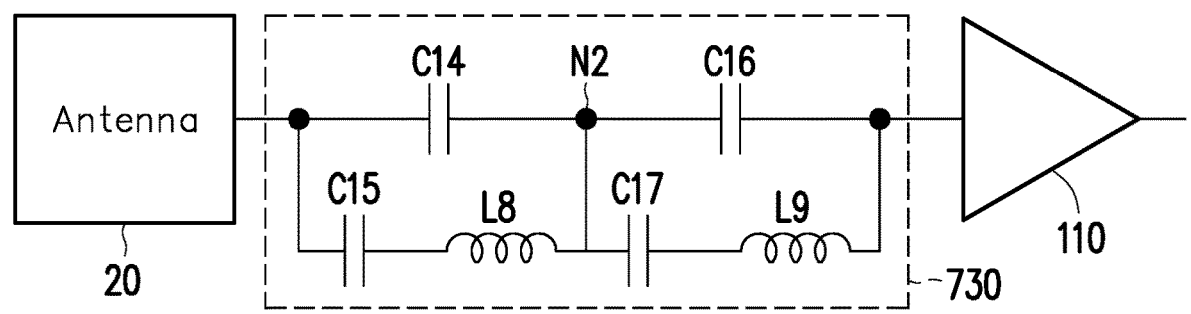
FIG. 11 is a circuit block diagram of a resonant circuit shown in FIG. 7 according to still another embodiment of the invention.

FIG. 11 is a circuit block diagram of the resonant circuit 730 shown in FIG. 7 according to still another embodiment of the invention. The resonant circuit 730 shown in FIG. 11 includes a capacitor C14, a capacitor C15, a capacitor C16, a capacitor C17, an inductor L8 and an inductor L9. The capacitor C14 is coupled between the signal providing terminal (e.g., the antenna 20) and a common node N2. The inductor L8 and the capacitor C15 are connected in series between the signal providing terminal (e.g., the antenna 20) and the common node N2. The capacitor C16 is coupled between the common node N2 and the input terminal of the first amplifier 110. The inductor L9 and the capacitor C17 are connected in series between the common node N2 and the input terminal of the first amplifier 110.

Figure 12:
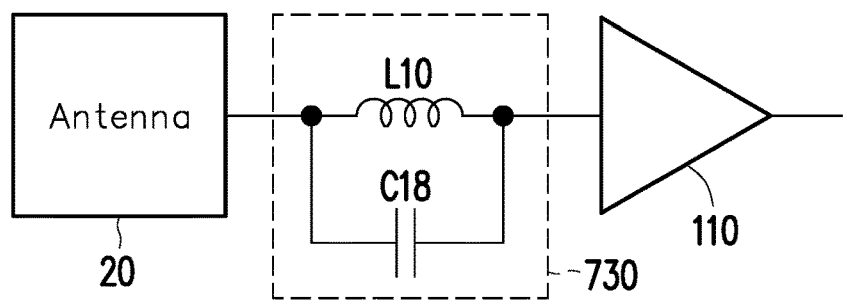
FIG. 12 is a circuit block diagram of a resonant circuit shown in FIG. 7 according to again another embodiment of the invention.

FIG. 12 is a circuit block diagram of the resonant circuit 730 shown in FIG. 7 according to again another embodiment of the invention. The resonant circuit 730 shown in FIG. 12 includes a capacitor C18 and an inductor L10. A first terminal of the capacitor C18 is suitable for coupling to the signal providing terminal (e.g., the antenna 20). A second terminal of the capacitor C18 is coupled to the input terminal of the first amplifier 110. A first terminal and a second terminal of the inductor L10 are respectively coupled to the first terminal and the second terminal of the capacitor C18.

Figure 13:
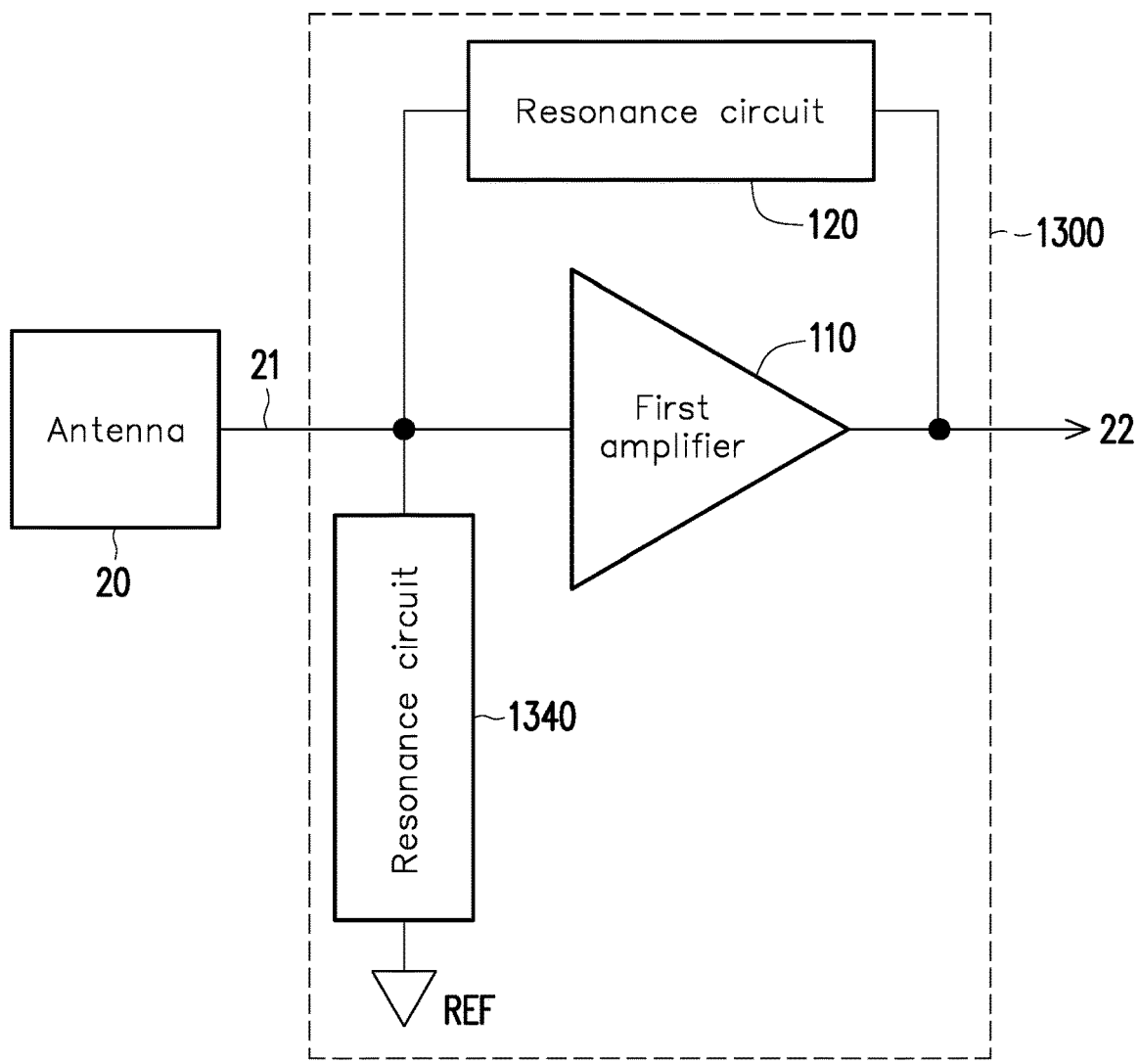
FIG. 13 is a circuit block diagram illustrating a radio frequency apparatus according to yet another embodiment of the invention.

FIG. 13 is a circuit block diagram illustrating a radio frequency apparatus according to yet another embodiment of the invention. The radio frequency apparatus shown in FIG. 13 includes an antenna 20 and an RF amplifier apparatus 1300. The RF amplifier apparatus 1300 may amplify the RF signal 21 received by the antenna 20, and output the amplified RF signal 22 to the next stage circuit (not shown). The antenna 20, the RF signal 21, the RF signal 22 and the RF amplifier apparatus 1300 shown in FIG. 13 could be deduced by analogy with reference to the related description of the antenna 20, the RF signal 21, the RF signal 22 and the RF amplifier apparatus 100 shown in FIG. 1, which is not repeated hereinafter.

The RF amplifier apparatus 1300 shown in FIG. 13 includes a first amplifier 110, a resonant circuit 120 and a resonant circuit 1340. The first amplifier 110 and the resonance circuit 120 shown in FIG. 13 could be deduced by analogy with reference to the related description of the first amplifier 110 and the resonance circuit 120 shown in FIG. 1 to FIG. 6, which is not repeated hereinafter. In the embodiment shown by FIG. 13, a first terminal of the resonant circuit 1340 is coupled to the input terminal of the first amplifier 110 to receive the RF signal 21. A second terminal of the resonant circuit 1340 is coupled to a reference voltage terminal REF (e.g., a ground voltage or other fixed voltages). The resonant circuit 1340 may provide a high impedance path for the first frequency component f1 of the RF signal 21 between the first terminal and the second terminal of the resonant circuit 1340. The resonant circuit 1340 may also provide a low impedance path for the second frequency component f2 of the RF signal 21 (i.e., the OOB noise) between the first terminal and the second terminal of the resonant circuit 1340. In this embodiment, the impedance of the resonance circuit 1340 to the first frequency component f1 of the RF signal 21 is greater than the impedance of the resonance circuit 1340 to the second frequency component f2 of the RF signal 21.

Based on the above, the resonance circuit 1340 of this embodiment is configured in the RF amplifier apparatus 1300. The resonant circuit 1340 may provide a low impedance path for the second frequency component f2 of the RF signal 21 (i.e., the OOB noise) between the input terminal of the first amplifier 110 and the reference voltage terminal REF. Therefore, the OOB noise could be effectively suppressed.

Figure 14:
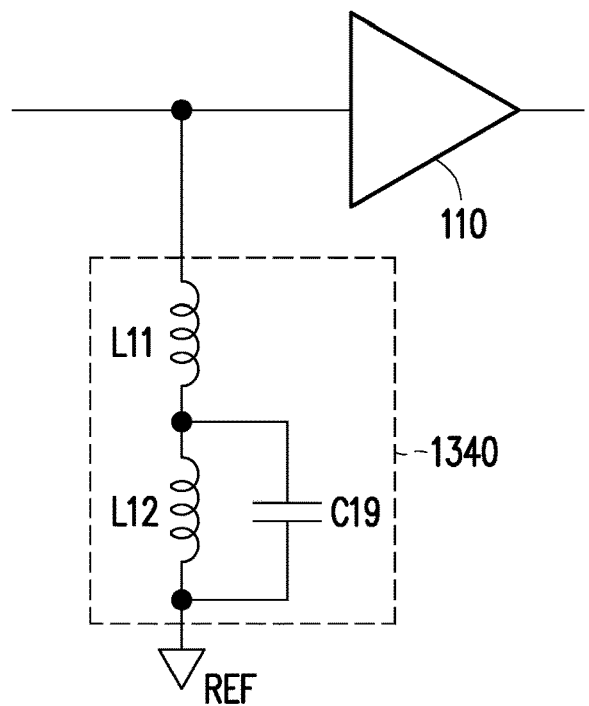
FIG. 14 is a circuit block diagram of a resonant circuit shown in FIG. 13 according to an embodiment of the invention.

FIG. 14 is a circuit block diagram of the resonant circuit 1340 shown in FIG. 13 according to an embodiment of the invention. The resonant circuit 1340 shown in FIG. 14 includes an inductor L11, an inductor L12 and a capacitor C19. A first terminal of the inductor L11 is coupled to the first terminal of the resonant circuit 1340, i.e., coupled to the input terminal of the first amplifier 110. A first terminal of the inductor L12 is coupled to a second terminal of the inductor L11. A second terminal of the inductor L12 is coupled to the second terminal of the resonant circuit 1340, i.e., coupled to the reference voltage terminal REF. A first terminal and a second terminal of the capacitor C19 are respectively coupled to the first terminal and the second terminal of the inductor L12.

Figure 15:
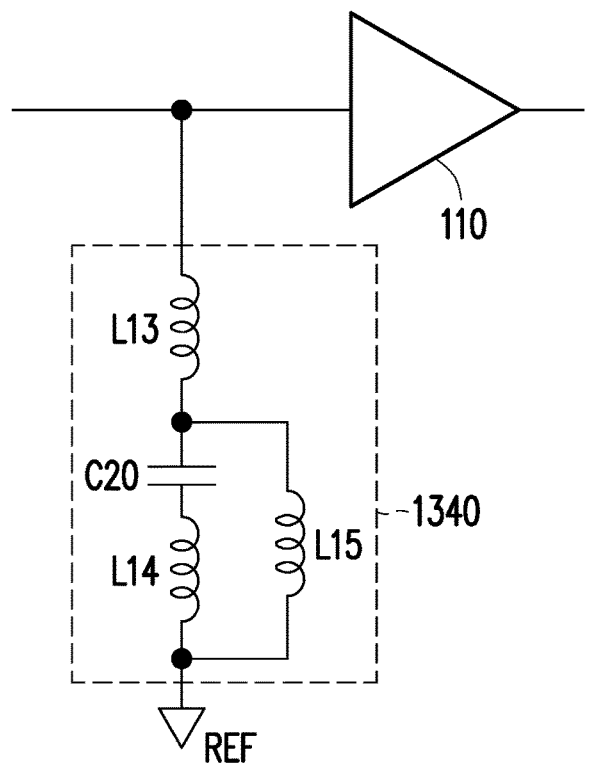
FIG. 15 is a circuit block diagram of a resonant circuit shown in FIG. 13 according to another embodiment of the invention.

FIG. 15 is a circuit block diagram of the resonant circuit 1340 shown in FIG. 13 according to another embodiment of the invention. The resonant circuit 1340 shown in FIG. 15 includes an inductor L13, an inductor L14, an inductor L15 and a capacitor C20. A first terminal of the inductor L13 is coupled to the first terminal of the resonant circuit 1340, i.e., coupled to the input terminal of the first amplifier 110. A first terminal of the capacitor C20 is coupled to a second terminal of the inductor L13. A first terminal of the inductor L14 is coupled to a second terminal of the capacitor C20. A second terminal of the inductor L14 is coupled to the second terminal of the resonant circuit 1340, i.e., coupled to the reference voltage terminal REF. A first terminal and a second terminal of the inductor L15 are respectively coupled to the first terminal of the capacitor C20 and the second terminal of the inductor L14.

Figure 16:
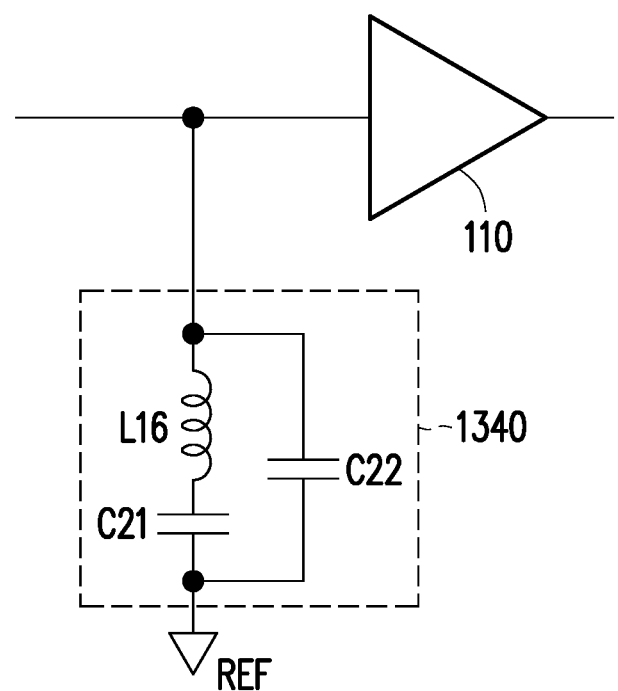
FIG. 16 is a circuit block diagram of a resonant circuit shown in FIG. 13 according to another embodiment of the invention.

FIG. 16 is a circuit block diagram of the resonant circuit 1340 shown in FIG. 13 according to another embodiment of the invention. The resonant circuit 1340 shown in FIG. 16 includes an inductor L16, a capacitor C21 and a capacitor C22. A first terminal of the inductor L16 is coupled to the first terminal of the resonant circuit 1340, i.e., coupled to the input terminal of the first amplifier 110. A first terminal of the capacitor C21 is coupled to a second terminal of the inductor L16. A second terminal of the capacitor C21 is coupled to the second terminal of the resonant circuit 1340, i.e., coupled to the reference voltage terminal REF. A first terminal and a second terminal of the capacitor C22 are respectively coupled to the first terminal of the inductor L16 and the second terminal of the capacitor C21.

Figure 17:
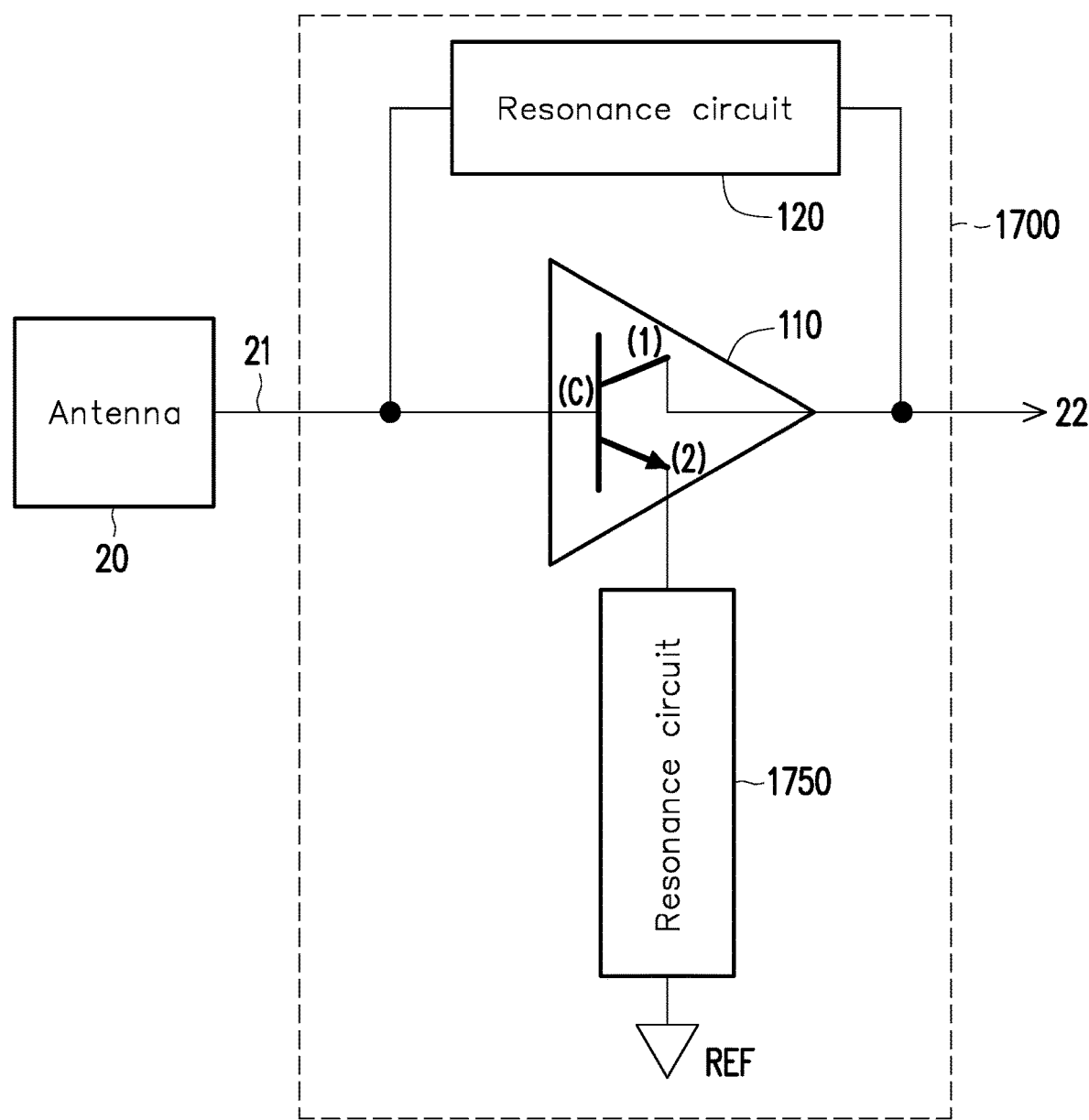
FIG. 17 is a circuit block diagram illustrating a radio frequency apparatus according to yet another embodiment of the invention.

FIG. 17 is a circuit block diagram illustrating a radio frequency apparatus according to yet another embodiment of the invention. The radio frequency apparatus shown in FIG. 17 includes an antenna 20 and an RF amplifier apparatus 1700. The RF amplifier apparatus 1700 may amplify the RF signal 21 received by the antenna 20, and output the amplified RF signal 22 to the next stage circuit (not shown). The antenna 20, the RF signal 21, the RF signal 22 and the RF amplifier apparatus 1700 shown in FIG. 17 could be deduced by analogy with reference to the related description of the antenna 20, the RF signal 21, the RF signal 22 and the RF amplifier apparatus 100 shown in FIG. 1, which is not repeated hereinafter.

The RF amplifier apparatus 1700 shown in FIG. 17 includes a first amplifier 110, a resonant circuit 120 and a resonant circuit 1750. The first amplifier 110 and the resonance circuit 120 shown in FIG. 17 could be deduced by analogy with reference to the related description of the first amplifier 110 and the resonance circuit 120 shown in FIG. 1 to FIG. 6, which is not repeated hereinafter. In the embodiment shown by FIG. 17, a first terminal of the resonant circuit 1750 is coupled to a reference terminal of the first amplifier 110 (the reference terminal is configured to receive a reference voltage). A second terminal of the resonant circuit 1750 is coupled to a reference voltage terminal REF (e.g., a ground voltage or other fixed voltages). The resonant circuit 1750 may provide a high impedance path for the first frequency component f1 between the first terminal and the second terminal of the resonant circuit 1750. The resonant circuit 1750 may also provide a low impedance path for the second frequency component f2 (i.e., the OOB noise) between the first terminal and the second terminal of the resonant circuit 1750. In the embodiment of FIG. 17, the first amplifier 110 may be a transistor having a first terminal (1), a second terminal (2) and a control terminal (C). The first terminal (1) may be the output terminal of the first amplifier 110. The second terminal (2) may be the reference terminal of the first amplifier 110. The control terminal (1) may be the input terminal of the first amplifier 110. In this embodiment, the impedance of the resonance circuit 1750 to the first frequency component f1 is greater than the impedance of the resonance circuit 1750 to the second frequency component f2.

Based on the above, the resonance circuit 1750 of this embodiment is configured in the RF amplifier apparatus 1700. The resonant circuit 1750 may provide a low impedance path for the second frequency component f2 (i.e., the OOB noise) between the reference terminal of the first amplifier 110 and the reference voltage terminal REF. Therefore, the OOB noise could be effectively suppressed.

Figure 18:
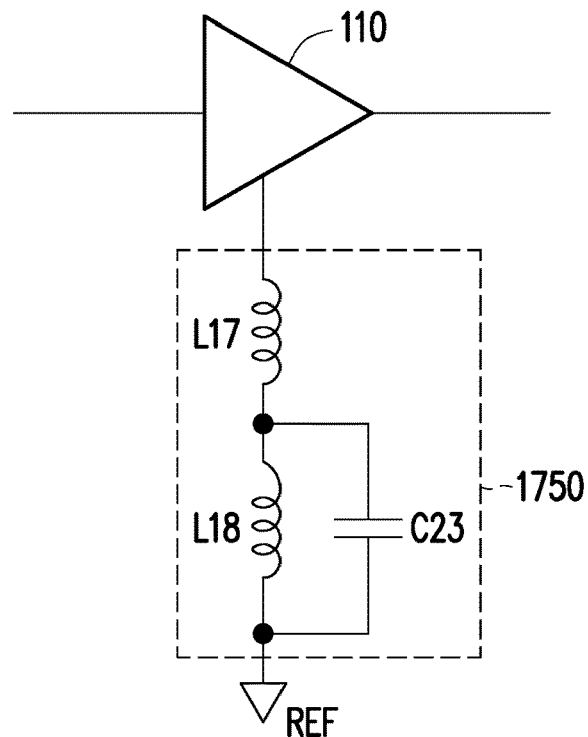
FIG. 18 is a circuit block diagram of a resonant circuit shown in FIG. 17 according to an embodiment of the invention.

FIG. 18 is a circuit block diagram of the resonant circuit 1750 shown in FIG. 17 according to an embodiment of the invention. The resonant circuit 1750 shown in FIG. 18 includes an inductor L17, an inductor L18 and a capacitor C23. A first terminal of the inductor L17 is coupled to the first terminal of the resonant circuit 1750, i.e., coupled to the reference terminal of the first amplifier 110. A first terminal of the inductor L18 is coupled to a second terminal of the inductor L17. A second terminal of the inductor L18 is coupled to the second terminal of the resonant circuit 1750, i.e., coupled to the reference voltage terminal REF. A first terminal and a second terminal of the capacitor C23 are respectively coupled to the first terminal and the second terminal of the inductor L18.

Figure 19:
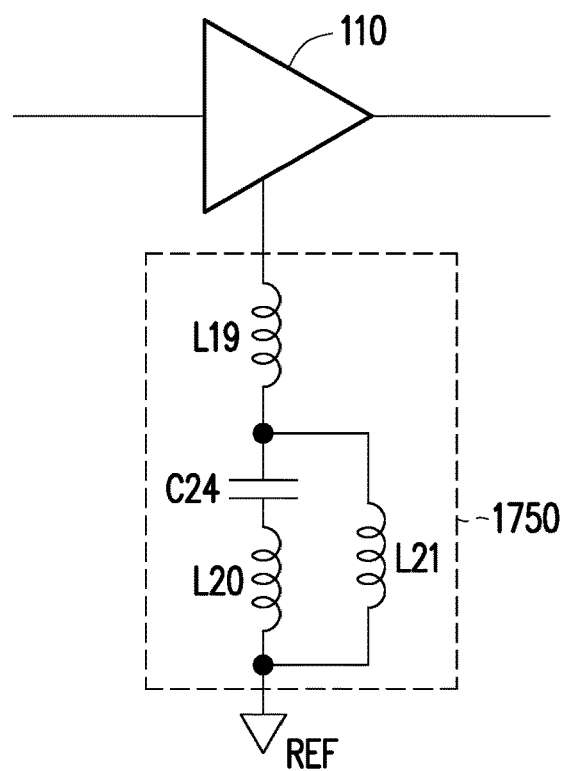
FIG. 19 is a circuit block diagram of a resonant circuit shown in FIG. 17 according to another embodiment of the invention.

FIG. 19 is a circuit block diagram of the resonant circuit 1750 shown in FIG. 17 according to another embodiment of the invention. The resonant circuit 1750 shown in FIG. 19 includes an inductor L19, an inductor L20, an inductor L21 and a capacitor C24. A first terminal of the inductor L19 is coupled to the first terminal of the resonant circuit 1750, i.e., coupled to the reference terminal of the first amplifier 110. A first terminal of the capacitor C24 is coupled to a second terminal of the inductor L19. A first terminal of the inductor L20 is coupled to a second terminal of the capacitor C24. A second terminal of the inductor L20 is coupled to the second terminal of the resonant circuit 1750, i.e., coupled to the reference voltage terminal REF. A first terminal and a second terminal of the inductor L21 are respectively coupled to the first terminal of the capacitor C24 and the second terminal of the inductor L20.

Figure 20:
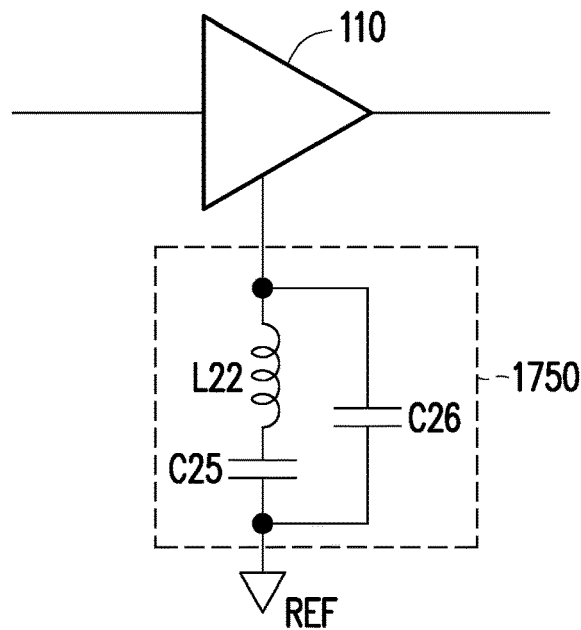
FIG. 20 is a circuit block diagram of a resonant circuit shown in FIG. 17 according to yet another embodiment of the invention.

FIG. 20 is a circuit block diagram of the resonant circuit 1750 shown in FIG. 17 according to yet another embodiment of the invention. The resonant circuit 1750 shown in FIG. 20 includes an inductor L22, a capacitor C25 and a capacitor C26. A first terminal of the inductor L22 is coupled to the first terminal of the resonant circuit 1750, i.e., coupled to the reference terminal of the first amplifier 110. A first terminal of the capacitor C25 is coupled to a second terminal of the inductor L22. A second terminal of the capacitor C25 is coupled to the second terminal of the resonant circuit 1750, i.e., coupled to the reference voltage terminal REF. A first terminal and a second terminal of the capacitor C26 are respectively coupled to the first terminal of the inductor L22 and the second terminal of the capacitor C25.

Figure 21:
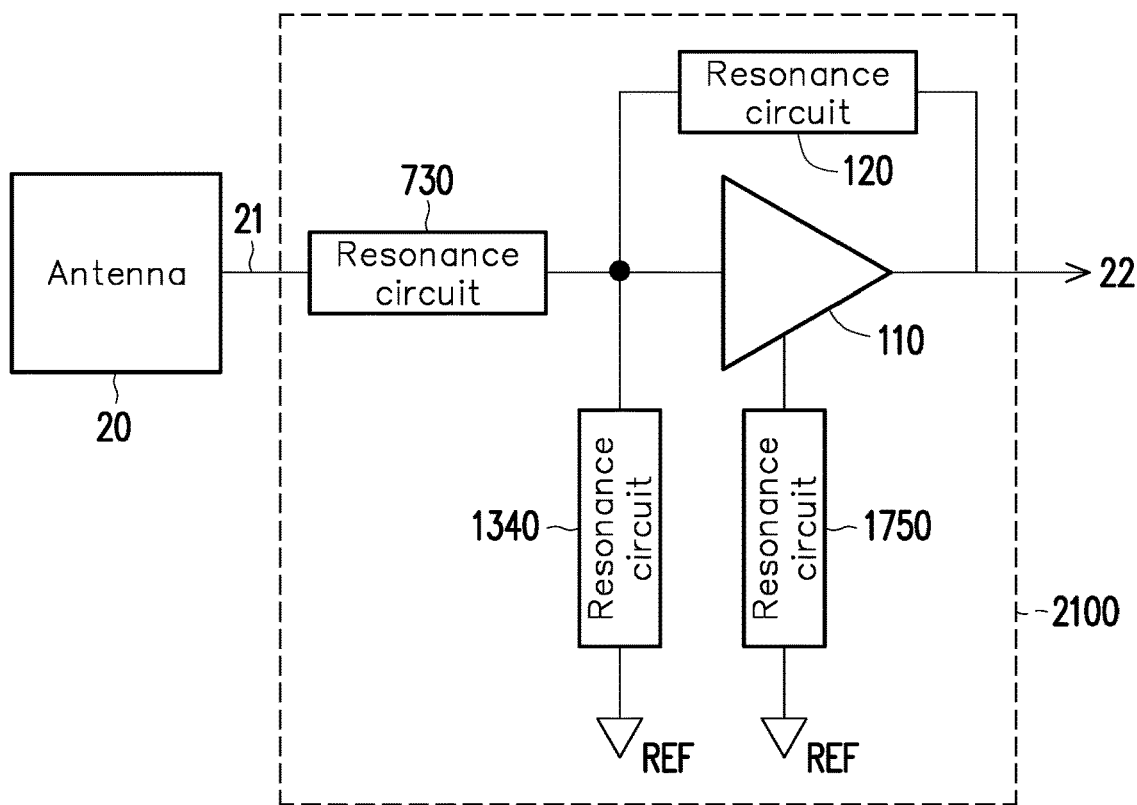
FIG. 21 is a circuit block diagram illustrating a radio frequency apparatus according to still another embodiment of the invention.

FIG. 21 is a circuit block diagram illustrating a radio frequency apparatus according to still another embodiment of the invention. The radio frequency apparatus shown in FIG. 21 includes an antenna 20 and an RF amplifier apparatus 2100. The RF amplifier apparatus 2100 may amplify the RF signal 21 received by the antenna 20, and output the amplified RF signal 22 to the next stage circuit (not shown). The antenna 20, the RF signal 21, the RF signal 22 and the RF amplifier apparatus 2100 shown in FIG. 21 could be deduced by analogy with reference to the related description of the antenna 20, the RF signal 21, the RF signal 22 and the RF amplifier apparatus 100 shown in FIG. 1, which is not repeated hereinafter.

The RF amplifier apparatus 2100 shown in FIG. 21 includes a first amplifier 110, a resonance circuit 120, a resonance circuit 730, a resonance circuit 1340 and a resonance circuit 1750. The first amplifier 110 and the resonance circuit 120 shown in FIG. 21 could be deduced by analogy with reference to the related description of the first amplifier 110 and the resonance circuit 120 shown in FIG. 1 to FIG. 6. The resonance circuit 730 shown in FIG. 21 could be deduced by analogy with reference to the related description of the resonance circuit 730 shown in FIG. 7 to FIG. 12. The resonance circuit 1340 shown in FIG. 21 could be deduced by analogy with reference to the related description of the resonance circuit 1340 shown in FIG. 13 to FIG. 16. The resonance circuit 1750 shown in FIG. 21 could be deduced by analogy with reference to the related description of the resonance circuit 1750 shown in FIG. 17 to FIG. 20. Those descriptions will not repeated hereinafter.

In summary, the resonance circuits 120, 730, 1340, and (or) 1750 described in the foregoing embodiments are configured in the RF amplifier apparatus. The resonant circuit 120 may provide a low impedance path for the second frequency component f2 (i.e., the OOB noise) between the input terminal and the output terminal of the first amplifier 110. The resonant circuit 730 may provide a high impedance path for the third frequency component f3 (i.e., the OOB noise) between the antenna 20 and the input terminal of the first amplifier 110. The resonant circuit 1340 may provide a low impedance path for the second frequency component f2 (i.e., the OOB noise) between the input terminal of the first amplifier 110 and the reference voltage terminal REF. The resonant circuit 1750 may provide a low impedance path for the second frequency component f2 (i.e., the OOB noise) between the reference terminal of the first amplifier 110 and the reference voltage terminal REF. Therefore, the OOB noise could be effectively suppressed.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The invention claimed is:
1. An RF amplifier apparatus, comprising:
a first amplifier, having an input terminal suitable for coupling to a signal providing terminal to input a first RF signal, wherein the first amplifier is configured to amplify a first frequency component of the first RF signal and output the amplified first frequency component to an output terminal of the first amplifier; and a first resonant circuit, having a first terminal and a second terminal respectively coupled to the input terminal and the output terminal of the first amplifier, wherein the first resonant circuit is configured to provide a first low impedance path for a second frequency component of the first RF signal between the input terminal and the output terminal of the first amplifier, and provides a first high impedance path for the first frequency component of the first RF signal between the input terminal and the output terminal of the first amplifier, so as to form a negative feedback path of the second frequency component from the output terminal of the first amplifier to the input terminal of the first amplifier to suppress the second frequency component.

2. An RF amplifier apparatus, comprising:
a first amplifier, having an input terminal suitable for coupling to a signal providing terminal to input a first RF signal, wherein the first amplifier is configured to amplify a first frequency component of the first RF signal and output the amplified first frequency component to an output terminal of the first amplifier; and
a first resonant circuit, having a first terminal and a second terminal respectively coupled to the input terminal and the output terminal of the first amplifier, wherein the first resonant circuit is configured to provide a first low impedance path for a second frequency component of the first RF signal between the input terminal and the output terminal of the first amplifier, and provides a first high impedance path for the first frequency component of the first RF signal between the input terminal and the output terminal of the first amplifier,
wherein the signal providing terminal is further suitable for coupling to a second amplifier, and the second amplifier is configured to output an amplified RF signal, wherein the amplified RF signal comprises the second frequency component.

3. The RF amplifier apparatus of claim 1, wherein the first resonant circuit comprises:
a first resonance component, having a first terminal and a second terminal respectively coupled to the first terminal and the second terminal of the first resonance circuit; and
a second resonance component, having a first terminal and a second terminal respectively coupled to the first terminal and the second terminal of the first resonance circuit.

4. The RF amplifier apparatus of claim 3, wherein the first resonance component comprises:
a first capacitor, having a first terminal and a second terminal respectively coupled to the first terminal and the second terminal of the first resonance circuit.

5. The RF amplifier apparatus of claim 3, wherein the second resonance component comprises:
a second capacitor; and
a resistor, wherein the resistor and the second capacitor are connected in series between the first terminal of the first resonant circuit and the second terminal of the first resonant circuit.

6. The RF amplifier apparatus of claim 3, wherein the second resonance component comprises:
a second capacitor; and
a first inductor, wherein the first inductor and the second capacitor are connected in series between the first terminal of the first resonant circuit and the second terminal of the first resonant circuit.

7. The RF amplifier apparatus of claim 6, wherein the first resonant circuit further comprises:
a third resonance component, having a first terminal and a second terminal respectively coupled to the first terminal and the second terminal of the first resonance circuit, wherein the third resonance component comprises:
a third capacitor; and
a second inductor, wherein the second inductor and the third capacitor are connected in series between the first terminal of the first resonant circuit and the second terminal of the first resonant circuit.

8. The RF amplifier apparatus of claim 1, wherein the first resonant circuit comprises:
a resistor;
a first capacitor, wherein the first capacitor and the resistor are connected in series between the first terminal and the second terminal of the first resonant circuit;
a second capacitor; and
an inductor, wherein the inductor and the second capacitor are connected in series between a first terminal and a second terminal of the first capacitor.

9. The RF amplifier apparatus of claim 1, wherein the first resonant circuit comprises:
a first capacitor, coupled between the first terminal of the first resonant circuit and a common node;
a second capacitor;
a first inductor, wherein the first inductor and the second capacitor are connected in series between the first terminal of the first resonant circuit and the common node;
a third capacitor, coupled between the common node and the second terminal of the first resonant circuit;
a fourth capacitor; and
a second inductor, wherein the second inductor and the fourth capacitor are connected in series between the common node and the second terminal of the first resonant circuit.

10. An RF amplifier apparatus, comprising:
a first amplifier, having an input terminal suitable for coupling to a signal providing terminal to input a first RF signal, wherein the first amplifier is configured to amplify a first frequency component of the first RF signal and output the amplified first frequency component to an output terminal of the first amplifier; and
a first resonant circuit, having a first terminal and a second terminal respectively coupled to the input terminal and the output terminal of the first amplifier, wherein the first resonant circuit is configured to provide a first low impedance path for a second frequency component of the first RF signal between the input terminal and the output terminal of the first amplifier, and provides a first high impedance path for the first frequency component of the first RF signal between the input terminal and the output terminal of the first amplifier,
wherein the RF amplifier apparatus further comprises:
a second resonant circuit, having a first terminal coupled to the signal providing terminal to receive a second RF signal, wherein a second terminal of the second resonant circuit is coupled to the input terminal of the first amplifier to provide the first RF signal, the second resonant circuit is configured to provide a second low impedance path for the first frequency component between the first terminal and the second terminal of the second resonant circuit to generate the first RF signal, and the second resonant circuit is configured to provide a second high impedance path for a third frequency component of the second RF signal between the first terminal and the second terminal of the second resonant circuit; or wherein the RF amplifier apparatus further comprises:

a third resonant circuit, having a first terminal coupled to the input terminal of the first amplifier, wherein a second terminal of the third resonant circuit is coupled to a reference voltage terminal, the third resonant circuit is configured to provide a high impedance path for the first frequency component between the first terminal and the second terminal of the third resonant circuit, and provide a low impedance path for the second frequency component between the first terminal and the second terminal of the third resonant circuit; or wherein the RF amplifier apparatus further comprises:

a fourth resonant circuit, having a first terminal coupled to a reference terminal of the first amplifier, wherein a second terminal of the fourth resonant circuit is coupled to a reference voltage terminal, the fourth resonant circuit is configured to provide a high impedance path for the first frequency component between the first terminal and the second terminal of the fourth resonant circuit, and provide a low impedance path for the second frequency component between the first terminal and the second terminal of the fourth resonant circuit.

11. The RF amplifier apparatus of claim 10, wherein the second resonant circuit comprises:

a first capacitor, having a first terminal suitable for coupling to the signal providing terminal, wherein a second terminal of the first capacitor is coupled to the input terminal of the first amplifier;

a second capacitor; and a first inductor, wherein the first inductor and the second capacitor are connected in series between the first terminal and the second terminal of the first capacitor.

12. The RF amplifier apparatus of claim 11, wherein the second resonant circuit further comprises:

a third capacitor; and a second inductor, wherein the second inductor and the third capacitor are connected in series between the first terminal and the second terminal of the first capacitor.

13. The RF amplifier apparatus of claim 10, wherein the second resonant circuit comprises:

a resistor, having a first terminal suitable for coupling to the signal providing terminal;

a first capacitor, wherein the first capacitor and the resistor are connected in series between the signal providing terminal and the input terminal of the first amplifier;

a second capacitor; and an inductor, wherein the inductor and the second capacitor are connected in series between a first terminal and a second terminal of the first capacitor.

14. The RF amplifier apparatus of claim 10, wherein the second resonant circuit comprises:

a first capacitor, coupled between the signal providing terminal and a common node;

a second capacitor;

a first inductor, wherein the first inductor and the second capacitor are connected in series between the signal providing terminal and the common node;

a third capacitor, coupled between the common node and the input terminal of the first amplifier;

a fourth capacitor; and a second inductor, wherein the second inductor and the fourth capacitor are connected in series between the common node and the input terminal of the first amplifier.

15. The RF amplifier apparatus of claim 10, wherein the second resonant circuit comprises:

a capacitor, having a first terminal suitable for coupling to the signal providing terminal, wherein a second terminal of the capacitor is coupled to the input terminal of the first amplifier; and an inductor, having a first terminal and a second terminal respectively coupled to the first terminal and the second terminal of the capacitor.

16. The RF amplifier apparatus of claim 10, wherein the fourth resonant circuit comprises:

a first inductor, having a first terminal coupled to the first terminal of the fourth resonant circuit;

a second inductor, having a first terminal coupled to a second terminal of the first inductor, wherein a second terminal of the second inductor is coupled to the second terminal of the fourth resonant circuit; and a capacitor, having a first terminal and a second terminal respectively coupled to the first terminal and the second terminal of the second inductor.

17. The RF amplifier apparatus of claim 10, wherein the fourth resonant circuit comprises:

a first inductor, having a first terminal coupled to the first terminal of the fourth resonant circuit;

a capacitor, having a first terminal coupled to a second terminal of the first inductor;

a second inductor, having a first terminal coupled to a second terminal of the capacitor, wherein a second terminal of the second inductor is coupled to the second terminal of the fourth resonant circuit; and a third inductor, having a first terminal and a second terminal respectively coupled the first terminal of the capacitor and the second terminal of the second inductor.

18. The RF amplifier apparatus of claim 10, wherein the fourth resonant circuit comprises:

an inductor, having a first terminal coupled to the first terminal of the fourth resonant circuit;

a first capacitor, having a first terminal coupled to a second terminal of the inductor, wherein a second terminal of the first capacitor is coupled to the second terminal of the fourth resonant circuit; and a second capacitor, having a first terminal and a second terminal respectively coupled to the first terminal of the inductor and the second terminal of the first capacitor.

* * * * *